(12) United States Patent
De Crecy et al.

(10) Patent No.: US 8,583,403 B2
(45) Date of Patent: Nov. 12, 2013

(54) METHOD OF MEASURING AN ANISOTROPIC SURFACE DIFFUSION TENSOR OR SURFACE ENERGY ANISOTROPIES

(75) Inventors: Francois De Crecy, Seyssins (FR); Jean-Charles Barbe, Izeron (FR); Daniel Girardeau-Montaut, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 451 days.

(21) Appl. No.: 12/433,354

(22) Filed: Apr. 30, 2009

(65) Prior Publication Data

US 2009/0276181 A1 Nov. 5, 2009

(30) Foreign Application Priority Data

Apr. 30, 2008 (FR) ..................... 08 02439

(51) Int. Cl.
*G01B 3/22* (2006.01)
*G01B 21/30* (2006.01)

(52) U.S. Cl.
USPC ................. 702/167; 702/1; 702/33; 702/34; 702/127; 702/189; 73/760; 73/865.8; 73/866.3

(58) Field of Classification Search
USPC ............ 702/1, 33, 34, 127, 167, 189; 73/760, 73/865.8, 866.3
See application file for complete search history.

(56) References Cited

U.S. PATENT DOCUMENTS

| | | | |
|---|---|---|---|
| 5,665,199 A | 9/1997 | Sahota et al. | |
| 5,667,424 A | 9/1997 | Pan | |
| 6,010,538 A | 1/2000 | Sun et al. | |
| 6,623,993 B2 * | 9/2003 | Perrin et al. | 438/14 |

FOREIGN PATENT DOCUMENTS

FR 2 810 915 A 1/2002

OTHER PUBLICATIONS

E. Dornel, et al. "Surface Evolution of Strained Thin Solid Films: Stability Analysis and Time Evolution of Local Surface Pertubations", Eurosime 2007: International Conference.*
Wu Fang et al., "Ge-Induced Reversal of Surface Stress Anisotropy on Si(001)", Physical Review Letters USA, Sep. 25, 1995, pp. 2534-2537, vol. 75. No. 13.*
Yin et al.,"Surface roughening of silicon, thermal silicon dioxide, and low-k dielectric soral films in argon plasma", J. Vac. Sci. Technol. A 26(1)—American Vacuum Society, Jan./Feb. 2008, pp. 151-160.*
Panat et al., "Evolution of survave waviness in thin films via volume and surface diffusion", University of Illinois Department of Theoretical and Applied Mechanics, http/hdl.handle.net/2142/240, Mar. 2007.*
E. Dornel, et. al., "Surface diffusion dewetting of thin solid films: numerical method and application to Si/SiO2", Physical Review B, Mar. 15, 2006, pp. 115427-1, vol. 73.
E. Dornel, et. al., "Surface evolution of strained thin solid films: Stability analysis and time evolution of local surface perturbations", Eurosime 2007: International Conf.
Wu Fang, et. al., "Ge-induced reversal of surface stress anisotropy on Si (001)", Physical Review Letters USA, Sep. 25, 1995, pp. 2534-2537, vol. 75, No. 13.

* cited by examiner

*Primary Examiner* — Alexander H Taningco
*Assistant Examiner* — L. Anderson
(74) *Attorney, Agent, or Firm* — LaRiviere, Grubman & Payne, LLP

(57) ABSTRACT

A method for the determination of the diffusion tensor anisotropy or the surface energy anisotropy that does not require the formation of particular structures, and that is capable of being performed in cases of moderate-amplitude perturbations. The invention relates to measuring the temporal evolution of natural or artificial roughnesses, and analyzing the results in the firm of the 2D power spectral density for moderate-amplitude perturbations typically characterized by amplitude/wavelength ratios of the perturbation for a spatially defined perturbation having two wavelengths along two orthogonal directions, the ratios typically being less than 0.3.

22 Claims, No Drawings

METHOD OF MEASURING AN ANISOTROPIC SURFACE DIFFUSION TENSOR OR SURFACE ENERGY ANISOTROPIES

PRIORITY CLAIM

This application claims priority to French Patent Application Number 08 02439, entitled Method of Measuring an Anisotropic Surface Diffusion Tensor or Surface Energy Anisotropies, filed on Apr. 30, 2008.

TECHNICAL FIELD

The field of the invention is that of methods of measuring the effects due to surface diffusion phenomena. In certain fields, it may be particularly useful to quantify isotropic and especially anisotropic surface diffusion effects in solid materials.

BACKGROUND OF THE INVENTION

Many industrial applications are concerned with quantifying the surface diffusion anisotropy or surface energy anisotropy or any other material parameter that may combine these two quantities. As examples, we mention the industrial fields in which the following problems are encountered:

- in the metallurgy field: how to make a surface smooth so as to reduce its sensitivity to certain chemical corrosion modes or to reduce mechanical stress concentration sites liable to initiate cracks, or to reduce the capability of absorbing particles, dust or pollution;
- in the field of microtechnology and nanotechnology: how to make the surface of semiconductors smooth, this being for example important during processes for fabricating channels in MOSFET transistors; how to make the surface of various layers of materials smooth and homogeneous whenever it is important to control the quality and thickness of these layers, for example in the case of BAW (Bulk Acoustic Wave) resonators; how to make a fracture-initiated surface smooth, for example in a silicon-on-insulator fabrication process; how to fabricate buried channels or cavities starting from wells or trenches by surface diffusion, etc.

Surface diffusion is one of the four classical modes of material transport in the vicinity of a "free" surface or an interface (the other modes of transport are viscous diffusion, evaporation-condensation and volume diffusion), as described in the article by W. W. Mullins, "*Flattening of a Nearly Plane Solid Surface due to Capillarity*", J. of Applied Physics, Vol. 30, No. 1, pp. 77-83, 1959.

Surface diffusion, and especially self-diffusion corresponding to the diffusions of atoms or molecules of a type A on a surface predominantly of this same type A, is generally considered to be the predominant phenomenon at temperatures substantially below the melting point of the material.

In general, surface diffusion is controlled by the chemical potential $\mu$ (often called the capillary potential) defined by the following equation as described in the article by C. Herring, "*Surface tension as a motivation for sintering*", in "*Physics of powder metallurgy*", edited by W. E. Kingston, Mc Graw-Hill, 1951:

$$\mu = \left(\frac{\partial G}{\partial N}\right)_{T,\sigma}$$

where G is the Gibbs free energy of the system. N is the number of atoms in the system, the derivative being taken at constant temperature T and constant stress $\sigma$. In the absence of an electromagnetic field and chemical reactions, the Gibbs energy includes two terms, one deriving from the surface energy and the other from the volume elastic energy:

$$G = \int_{Surface} \gamma\, dS + \int_{Volume} \omega\, dV$$

where $\gamma$ is the surface energy density (usually simply called the "surface energy") and $\omega$ is the volume elastic energy density. Moreover, when the term deriving from the volume elastic energy can be neglected, which is justified in the case of barely strained materials, G reduces to the surface term $\int_{Surface} \gamma\, dS$.

It is generally considered that the surface energy depends only on the orientation of the surface, that is to say it is not necessarily isotropic. In this case, and for small perturbations, many authors, including C. Herring in "*Surface tension as a motivation for sintering*", published in "*Physics of powder metallurgy*", edited by W. E. Kingston, McGraw-Hill, 1951, and E Dornel in "*Évolution morphologique par diffusion de surface et application à l'étude du démouillage de films minces solides*" [Morphological evolution by surface diffusion and application to the study of dewetting in thin solid films]", thesis submitted at the Joseph Fourier University, Grenoble, Sep. 11, 2007, have shown that the potential can be expressed as:

$$\mu = \Omega_0 \ast ((\kappa_1 + \kappa_2) \ast \gamma_0 + \kappa_1 \gamma_1'' + \kappa_2 \gamma_2'')$$

where $\Omega_0$ is the atomic volume $k_1$ and $k_2$ are the two principal curvatures of the surface (these are positive when directed towards the material), $\gamma_0$ is the surface energy, and $\gamma_1''$ and $\gamma_2''$ are the second derivatives of the surface energy with respect to the orientation of the surface in the two directions associated with the principal curvatures $k_1$ and $k_2$ respectively (in the case of an isotropic surface, $\gamma_1''$ and $\gamma_2''$ are zero).

A material flux J occurs in the case of a potential gradient, which is given by:

$$J = -\left(\frac{D_s n_s}{k_B T}\right) \cdot \nabla_s \mu$$

where $D_s$ is the surface diffusion tensor, $n_s$ is the number of surface atoms per unit area, $k_B T$ is the thermal energy and $\Delta_s$ is the surface gradient operator. In the case of isotropic diffusion, and only in this case, $D_s$ is proportional to the unit matrix (diagonal tensor in which all the diagonal terms are equal) and can therefore be likened to a scalar, A major practical difficulty is that of measuring this diffusion tensor. By extending the calculations leading to the surface evolution equation as described by W. W. Mullins in: "*Theory of cavity thermal Grooving*", J. of Applied Physics, Vol. 28, No. 3, March 1957, it can be shown that, even more than this diffusion tensor, it is useful to determine the quantity B defined (in the case of isotropic diffusion and isotropic energy) by the following equation:

$$B = \frac{D_s \gamma n_s \Omega_o^2}{k_B T} \text{ in m}^4/\text{s}.$$

Atomistic simulation methods exist for estimating this diffusion coefficient by simulation. However, these calculations are either very tedious (ab initio method) or require (for Monte Carlo or molecular dynamics methods, necessitating "strong bond" models or at the very least inter atomic potentials validated for each particular case) hypotheses that are difficult to verify or prior ah initio calculations that are themselves very tedious.

Moreover, various methods have also been proposed for experimentally measuring this coefficient B. They often apply only in the case of isotropic diffusion. One of these methods, implicitly proposed by W. W. Mullins in "*Flattening of a Nearly Plane Solid Surface due to Capillarity*", J. of Applied Physics, Vol. 30, No.1, pp.77-83, 1959, consists in etching lines or grooves on the surface and then measuring the temporal evolution of the transverse profile of the groove. This author proposes a series of equations for predicting this evolution. By reversing this system, it is possible to obtain the coefficient B.

An alternative method consists in etching quite simple structures in the material, for example wells or trenches, and in simulating, by analytical formulae or by scientific software (for example MoveFilm as described by E. Dornel in "*Évolution morphologique par diffusion de surface et application à l'étude du démouillage de films minces solides*", [Morphological evolution by surface diffusion and application to the study of dewetting in thin solid films]", thesis submitted at the Joseph Fourier University, Grenoble, Sep. 11, 2007; E. Dornel et al. in "*Surface diffusion dewetting of thin solid films: Numerical methods and application to Si/SiO₂*", Physical Review B, 73, 115427, 2006), the evolution of the topology due to the effect of the surface diffusion and in measuring the true surface after it has undergone the true surface evolution by diffusion (generally by annealing at temperature, in a vacuum or in a suitable atmosphere) for a measured time.

By comparing the measured and simulated surface topology evolutions, it is generally possible to estimate the coefficient B and therefore the diffusion coefficient $D_s$, assuming the surface energy γ is known, These methods require the formation of special, often microscopic, structures, which may be difficult or expensive. The real need is therefore to have a simple method of experimentally characterizing the diffusion coefficient or the coefficient B that does not require the formation of particular structures.

In addition, the methods described above do not apply or are poorly applicable to the case in which the diffusion coefficient or the surface energy are anisotropic.

BRIEF SUMMARY OF THE INVENTION

Within this context, the present invention provides a method of determining the anisotropies of the diffusion tensor or the anisotropies of the surface energy or the anisotropies of the coefficient B that does not require the formation of particular structures and enables this type of determination to be performed in the case of moderate-amplitude perturbations.

The invention is based on measuring the temporal evolution of natural or artificial roughnesses and analysis of the results in 2D power spectral density form in the case of moderate-amplitude perturbations typically characterized by amplitude/wavelength ratios of the perturbation for a spatially defined perturbation having two wavelengths along two orthogonal directions, said ratios being typically less than 0.3.

More specifically, the subject of the invention is a method of measuring an anisotropic surface diffusion tensor or surface energy anisotropies of a surface of a material, this surface being defined by a function z(x,y) dependent on two co-ordinates (x,y) along two orthogonal directions and being treated as the sum of a set of moderate-amplitude perturbations of amplitude (a) and of wavelengths ($\lambda_x$, $\lambda_y$), the amplitude/wavelength ratios (a/$\lambda_x$; a/$\lambda_y$) being less than about 0.3, characterized in that it comprises the following steps:

a first measurement of the surface topology enabling the spatial Fourier transform $H(f_x, f_y, 0)$ of this first topology to be determined at an instant $t_0=0$ taken as a time reference, $f_x$ and $f_y$ being the spatial frequencies, that is to say the reciprocal of the wavelengths $\lambda_x$ and $\lambda_y$;

a step in which said surface evolves by surface diffusion;

a second measurement of the surface topology after evolution of said surface, enabling the spatial Fourier transform $H(f_x, f_y, t)$ of this second topology at an instant t to be determined, $f_x$ and $f_y$ being the spatial frequencies, that is to say the reciprocal of the wavelengths $\lambda_x$ and $\lambda_y$; and the determination of the components of the diffusion tensor or of the second derivatives of the surface energy, or a combination of both, enabling a measurement of the deviation between a quantity $H(f_x, f_y, t)$ and a quantity $H(f_x, f_y, 0) \cdot a(t)$ to be minimized, the function $H(f_x, f_y, t)$, being the spatial Fourier transform of a set of experimental measurements and $H(f_x, f_y, 0) \cdot a(t)$ being defined through a mathematical model based on the fact that the Applicant has shown that an initial perturbation corresponding to the following equation:

$$F(x,y,0) = a_0 \cos[2\pi x f_x] \cos[2\pi y f_y]$$

evolves, owing to surface diffusion, into the form:

$$FM(x, y, t) = a(t)\cos[2\pi x f_x]\cos[2\pi y f_y],$$

where:

$$a(t) = \frac{a_o}{\sqrt{1 + a_0^2 \alpha_2 (\max(f_x; f_y))^2} \cdot \sqrt{\exp\left(\frac{2t}{\tau_{theory}}\right) - \frac{a_0^2 \alpha_2 (\max(f_x; f_y))^2}{1 + a_0^2 \alpha_2 (\max(f_x; f_y))^2}}}$$

$\alpha_2$ being dependent on $f_x$ and $f_y$, $f_x$ and $f_y$ being the spatial frequencies in the orthogonal directions associated with the co-ordinates x and y, and $$\tau_{theory} = \frac{1}{C(d_x f_x^2 + d_y f_y^2)((\gamma_o + \gamma_x'') \cdot f_x^2 + (\gamma_o + \gamma_y'') f_y^2)}$$

and $d_x$ and $d_y$ are the components of the surface diffusion tensor in the two orthogonal directions associated with the co-ordinates x and y, $\gamma_0$ is the surface energy and $\gamma_x''$ and $\gamma_y''$ are the second derivatives of the surface energy with respect to the orientation of the surface in the orthogonal directions associated with the co-ordinates x and y.

According to one embodiment of the invention, the coefficient $\alpha_2$ satisfies the following equation:

$$\alpha_2 = \frac{\sum_{i=0}^{i=3} c_i \left( \ln \left[ \frac{\max[f_x; f_y]}{\min[f_x; f_y]} \right] \right)^i}{\sum_{i=0}^{i=3} b_i \left( \ln \left[ \frac{\max[f_x; f_y]}{\min[f_x; f_y]} \right] \right)^i}$$

$b_i$ and $c_i$ being constants.

According to one embodiment of the invention, the method includes an annealing step for generating the surface evolution.

Advantageously, the annealing temperature is substantially below the melting point of the crystallographic material.

According to one embodiment of the invention, the measurement of the deviation G satisfies the following formula:

$$G = \sum_{fx=fx\_min}^{fx\_max} \sum_{fy=fy\_min}^{fy\_max} (PSD(fx, fy, t) - PSD(fx, fy, 0) \ast a(t)^2)^2$$

where PSD $(f_x, f_y, t)$ is the power spectral density corresponding to the square of the norm of the Fourier transform at time t, i.e. $H(f_x, f_y, t)$ and $PSD(f_x, f_y, 0)$ is the power spectral density at time $t_0$ equal to the square of the norm of the Fourier transform at $t_0=0$, i.e. $H(f_x, f_y, 0)$.

According to one embodiment of the invention, the measurement of the deviation G' satisfies the following formula:

$$G' = \sum_{fx=fx\_min}^{fx\_max} \sum_{fy=fy\_min}^{fy\_max} (\|H(fx, fy, t)\| - \|H(fx, fy, 0)\| \ast a(t))^2$$

where $\|H(f_x, f_y, t)\|$ is the norm of the Fourier transform at the frequencies $f_x$ and $f_y$ and at time t, and
$\|H(f_x, f_y, 0)\|$ is the norm of the Fourier transform at the frequencies $f_x$ and $f_y$ and at the initial time $t_0=0$.

According one embodiment of the invention, the topology measurement is of the AFM (Atomic Force Microscopy) type. The atomic force microscope (AFM) is a very high-resolution type of scanning probe microscopy, with demonstrated spatial resolution of fractions of a nanometer. The information is gathered by "feeling" the surface with a mechanical probe. The AFM consists of a microscale cantilever with a sharp tip (probe) at its end that is used to scan the specimen surface. The cantilever is typically silicon or silicon nitride with a tip radius of curvature on the order of ten nanometers. The tip is brought in the near vicinity of a sample surface, as to sense the force (attractive and then repulsive) acting between the tip and the sample. According the the operating mode (contact, dynamic), these forces lead to a change in the deflection or in the amplitude of vibration of the cantilever. Typically, this change is measured using a laser spot reflected from the top surface of the cantilever into an array of photodiodes.

The AFM can be operated in various modes, depending on the application. The primary modes of operation are static (contact) mode and dynamic mode. In the static mode operation, the static tip deflection is used as a feedback signal. In the dynamic mode, the cantilever is externally oscillated at or close to its fundamental resonance frequency or a harmonic. The oscillation amplitude, phase and resonance frequency are modified by tip-sample interaction forces; these changes in oscillation with respect to the external reference oscillation provide information about the sample's characteristics.

In tapping mode the cantilever is driven to oscillate up and down at near its resonance frequency by a small piezoelectric element mounted in the AFM tip holder. Due to the interaction of forces acting on the cantilever when the tip comes close to the surface, van der Waals force, electrostatic forces, etc cause the amplitude of this oscillation to decrease as the tip gets closer to the sample. An electronic servo uses the piezoelectric actuator to control the height of the cantilever above the sample.

In non-contact mode, the tip does not sense the repulsive part of the potential. The cantilever is instead oscillated at a frequency slightly under its resonance frequency with a fixed amplitude of oscillation typically less than 10 nm. The van der Waals forces, which are strongest from 1 nm to 10 nm above the surface, or any other long range force which extends above the surface acts to decrease the resonance frequency of the cantilever. This decrease in resonance frequency combined with the feedback loop system maintains a constant oscillation amplitude or frequency by adjusting the average tip-to-sample distance. Measuring the tip-to-sample distance at each (x,y) data point allows the scanning software to construct a topographic image of the sample surface.

According to one embodiment of the invention, the topology measurement is of the optical profilometry type. Optical profilometry is a rapid, nondestructive, and non-contact surface metrology technique. An optical profiler is a type of microscope in which light from a lamp is split into two paths by a beam splitter. One path directs the light onto the surface under test, the other path directs the light to a reference mirror. Reflections from the two surfaces are recombined and projected onto an array detector. When the path difference between the recombined beams is on the order of a few wavelengths of light or less interference can occur. This interference contains information about the surface contours of the test surface. Vertical resolution can be on the order of several angstroms while lateral resolution depends upon the objective and is typically in the range of 0.5-5 microns.

According to one embodiment of the invention, the topology measurement is of the confocal microscopy type. Confocal microscopy is an optical imaging technique that can be used to reconstruct three-dimensional images by using a spatial pinhole to eliminate out-of-focus light or flare in specimens that are thicker than the focal plane. A confocal microscope uses point illumination and a pinhole in an optically conjugate plane in front of the detector to eliminate out-of-focus information. Only the light within the focal plane can be detected, so the image quality is much better than that of wide-field images. As only one point is illuminated at a time in confocal microscopy, 2D or 3D imaging requires scanning over a regular raster (i.e. a rectangular pattern of parallel scanning lines) in the specimen. These microscopes also are able to see into the image by taking images at different depths. Scanning confocal light microscopy offers an alternative three-dimensional imaging technique that can allow a fresh view of surfaces. It can image samples that are wet, coated, or porous and cope with highly irregular surfaces for which the desired depth of field is difficult to study by other methods.

According to one embodiment of the invention, the topology measurement is carried out by tunnelling microscopy.

According to one embodiment of the invention, the method further includes a prior step of generating surface roughnesses.

According to one embodiment of the invention, the roughnesses are generated by chemical etching.

According to one embodiment of the invention, the roughnesses are generated by plasma etching.

According to one embodiment of the invention, the roughnesses are generated by electrolytic etching.

According to one embodiment of the invention, the roughnesses are generated by indentation of nano-indentation. In general, in this technology, indenting the surface of a material results in local modifications of the topology.

The invention will be better understood and other advantages will become apparent on reading the following description given by way of non-limiting example.

DETAILED DESCRIPTION

The invention is based on the fact that, in the case of small or moderate perturbations, the surface evolution is linear. This means that if the initial surface (at time $t_0=0$) can be expressed in the form $$z(x, y) = \sum_j a_j \cdot f_j(x, y) \quad \text{[eq. 1.1]}$$

and if the temporal evolution of each individual $f_j(x,y)$ can be expressed as $F_j(x,y,t)$, then the surface at any time t can be expressed as:

$$z(x, y, t) = \sum_j a_j \cdot F_j(x, y, t) \quad \text{[eq. 1.2]}$$

This property enables the surface to be expanded as a 2D Fourier series. It is then sufficient to calculate the evolution of a surface of initial equation (at t=0):

$$F(x,y,0) = \alpha_0 \cos[2\pi x f_x] \cos[2\pi y f_y] \quad \text{[eq. 1.3]}$$

where $a_0$ is the initial amplitude of the perturbation associated with the wavelengths $\lambda_x$ and $\lambda_y$, $\lambda_x$ being the wavelength along x and $\lambda_y$ the wavelength along y.

Except for a phase shift in $f_x$ and/or in $f_y$ (which is manifested here by a shift along x and/or along y), all the components of the Fourier series expansion may be expressed in this form.

The small-perturbation assumption amounts to assuming that $a_0 \ll \lambda_x$ and $a_0 \ll \lambda_y$, and it is also considered that the eigendirections of the diffusion tensor are parallel to the x and y axes.

Within the context of the invention, and for what are called "moderate" perturbations, it is considered that the following equation is valid provided that:

$$\max(a_0/\lambda_x, a_0/\lambda_y) < 0.3.$$

Under these conditions, the Applicant has established that if the eigendirections of the diffusion tensor are parallel to the x and y axes, the temporal evolution of the surface can be expressed as:

$$F(x,y,t) = a(t) \cos[2\pi x f_x] \cos[2\pi y f_y] \quad \text{[eq. 1.4]}$$

That is, again from the equation valid in the case of small perturbations:

$$a(t) = a_0 \exp[-C(d_x f_x^2 + d_y f_y^2)((\gamma_0+\gamma_x'')f_x^2 + (\gamma_0+\gamma_y'')f_y^2)t] \quad \text{[eq. 1.5]}$$

where:
$d_x$ is the diffusion coefficient in the x direction;
$d_y$ is the diffusion coefficient in the y direction;

$\gamma_0$ is the average surface energy in the direction normal to the (x,y) plane;

$\gamma_x''$ and $\gamma_y''$, respectively, are the second derivatives of the surface energy with respect to the orientation of the surface in the directions associated with the x co-ordinate and y co-ordinate respectively; and C is the physical coefficient depending only on the atomic properties of the surface and on the temperature, where:

$$C = \frac{16 n_s \pi^4 \Omega_o^2}{k_B T} \quad \text{[eq. 1.6]}$$

where, as previously, $n_s$ is the number of surface atoms per unit area, $k_B T$ is the thermal energy, and $\Omega_0$ is the atomic volume. Knowing the crystallographic structure of the material and the average crystallographic orientation of the surface, it is possible to obtain a numerical estimate of the coefficient C.

It is therefore established that the quantity:

$$[C(d_x f_x^2 + d_y f_y^2)((\gamma_0+\gamma_x'')f_x^2 + (\gamma_0+\gamma_y'')f_y^2)]$$

may be considered as the inverse of a theoretical characteristic time $\tau_{theory}$ for decreasing this perturbation:

$$a(t) = a_0 \exp\left[-\frac{t}{\tau_{theory}}\right] \quad \text{[eq. 1.7]}$$

where:

$$\tau_{theory} = \frac{1}{C(d_x f_x^2 + d_y f_y^2)((\gamma_o + \gamma_x'')f_x^2 + (\gamma_o + \gamma_y'')f_y^2)} \quad \text{[eq. 1.8]}$$

To remove the small-perturbation assumption constraint, the Applicant has demonstrated that it is possible, using scientific numerical simulation software constructed from the same bases as those described in the article by E. Dornel "*Évolution morphologique par diffusion de surface et application à l'étude du démoulillage de films minces solides*" [Morphological evolution by surface diffusion and application to the study of dewetting in thin solid films]", thesis submitted at the Joseph Fourier University, Grenoble, Sep. 11, 2007 and the article by E. Dornel et al. "*Surface diffusion dewetting of thin solid films: Numerical methods and application to Si/SiO₂*", Physical Review B, 73, 115427, 2006, which however deals with the 3D surface evolution, and as long as the ratios of the initial amplitude $a_0$ of the perturbation divided by its wavelengths $\lambda_x$ along x and $\lambda_y$ along y remain less than 0.3 ($a_0/\lambda_x < 0.3$ and $a_0/\lambda_x < 0.3$), to express the time derivative of the amplitude as a function of this amplitude a(t), of the theoretical characteristic time $\tau_{theory}$ and of the ratios $a(t)/\lambda_x$ and $a(t)/\lambda_y$ by the formula:

$$\frac{\partial a(t)}{\partial t} = -\frac{1 + \alpha_2 \max[a(t)f_x; a(t)f_y]^2}{\tau_{theory}} a(t) \quad \text{[eq. 1.9]}$$

where the coefficient $\alpha_2$ depends only on $\lambda_x$ and $\lambda_y$, according to formula [eq.1.11] described later.

The above differential equation is integrated and the following formula, valid both for small perturbations and moderate perturbations, is obtained:

$$a(t) = \frac{a_o}{\sqrt{1 + a_0^2 \alpha_2 (\max(f_x; f_y))^2} \cdot \sqrt{\exp\left(\frac{2t}{\tau_{theory}}\right) - \frac{a_0^2 \alpha_2 (\max(f_x; f_y))^2}{1 + a_0^2 \alpha_2 (\max(f_x; f_y))^2}}} \quad [\text{eq. 1.10}]$$

where $a_0$ is the value of the amplitude $a(t)$ for $t=0$ and $a_0=(0)$. It may be clearly seen that the formula for small perturbations is again obtained when $a_0/\lambda_x$ and $a_0/\lambda_y$ are small compared to 1.

The coefficient $\alpha_2$ depends only on $\lambda_x$ and $\lambda_y$, or, which is equivalent, on $f_x=1/\lambda_x$ and $f_y=1/\lambda_y$. The Applicant has performed a large number of calculations for $\lambda_x$ and $\lambda_y$ values such that $1/30<\lambda_x/\lambda_y<30$ and $a_0/\lambda_x$ and $a_0/\lambda_y$ values between 0.0005 and 0.30 and has found that this coefficient satisfies, to a very good approximation, the formula:

$$\alpha_2 = \frac{\sum_{i=0}^{i=3} c_i \left( \ln\left[ \frac{\max[f_x; f_y]}{\min[f_x; f_y]} \right] \right)^i}{\sum_{i=0}^{i=3} b_i \left( \ln\left[ \frac{\max[f_x; f_y]}{\min[f_x; f_y]} \right] \right)^i} \quad [\text{eq. 1.11}]$$

where ln represents the Naperian logarithm and the coefficients $c_i$ and $b_i$ have numerical values close to those in the following table:

| i   | 0       | 1       | 2       | 3      |
|-----|---------|---------|---------|--------|
| $c_i$ | 78.0309 | 70.7353 | 102.025 | 9.520  |
| $b_i$ | 1.000   | 1.76088 | 0.000   | 1.60881 |

The proposed invention consists in using this result to:
either estimate the two components $d_x$ and $d_y$ of the diffusion tensor (relative to the orientation of the surface in the directions associated with the x and y co-ordinates), knowing the surface energy $\gamma_0$ and its second derivatives $\gamma_x''$ and $\gamma_y''$ with respect to x and y (or only $\gamma_0$ if it may be assumed that the surface energy is isotropic)
or estimate the sums $\gamma_0+\gamma_x''$ and $\gamma_0+\gamma_y''$ (anisotropic surface energies) knowing the two components $d_x$ and $d_y$ of the diffusion tensor (or only the scalar diffusion coefficient $D_s$ if it may be assumed that the surface diffusion is isotropic)
or simultaneously estimate the three quantities below, whatever combination of these three quantities: $d_x(\gamma_0+\gamma_x'')$; $d_y(\gamma_0+\gamma_y'')$; $d_y(\gamma_0+\gamma_x'')+d_x(\gamma_0+\gamma_y'')$.

Thus, according to the invention:
in a first step, the initial topology at time $t_0=0$ of a rough surface (one having roughnesses with an amplitude/wavelength ratio of less than about 0.3) is measured, the measured zone being precisely located. Several profilometry techniques exist that are known to those skilled in the art. The most conventional one for small areas and small roughnesses is atomic force microscopy (AFM) or one of its many variants. It is also possible to use tunnelling microscopy or optical profilometry or confocal microscopy. In general it is necessary to make corrections to the raw measurements according to techniques also known to those skilled in the art;
in a second step, the surface is made to evolve by surface diffusion. This may typically be carried out by an annealing operation for a time t at quite a high temperature T, but substantially below the melting point; and
in a third step, a further measurement is made of the surface topology of the same zone (and therefore during the perturbation) as that measured previously.

This therefore gives two topologies of the same surface, before and after annealing.

The 2D Fourier transform of these two topologies is taken. This may be typically accomplished using techniques described in the book by W. H. Press et al. "Numerical recipes, the Art of Scientific Computing", 3rd Edition, Cambridge University Press, 2007.

This Fourier transform is considerably facilitated if the measurement is made on a square array of points (x,y) and if the number of measurements in each direction is a power of 2. The classical fast Fourier transform methods can then be used. This is very often the case for AFM measurements or for those using other profilometry methods.

These Fourier transforms, in particular that before annealing, are used notably for quantifying the initial amplitude $a_0$ of the perturbation in question of each component in terms of frequency $f_x$ and $f_y$, or in terms of wavelengths $\lambda_x$ and $\lambda_y$, and therefore are used to check whether the conditions $a_0/\lambda_x<0.3$ and $a_0/\lambda_y<0.3$ are indeed met.

According to a first embodiment of the invention, what is of interest is the square of the norm of the 2D Fourier transform, generally referred to as the power spectral density (PSD).

Thus, the following quantity G is to be considered:

$$G = \sum_{fx=fx\_min}^{fx\_max} \sum_{fy=fy\_min}^{fy\_max} (PSD(f_x, f_y, t) - PSD(f_x, f_y, 0) \cdot a(t)^2)^2$$

The double sum defining G is performed over the set of frequencies $f_x=1/\lambda_x$ and $f_y=1/\lambda_y$ present in the 2D Fourier transform. $PSD(f_x,f_y,t)$ is the value of the PSD at time t, $PSD(f_x,f_y,0)$ is the initial value of the PSD (at the reference time $t_0=0$), where $a(t)$ satisfies the equation [eq. 1.10].

This mode of implementation option has the advantage of being slightly closer to what profilometer users, who may employ the PSD for defining the RMS roughness, are often accustomed.

If the two components of the diffusion tensor are sought, knowing the surface energies and their second derivatives with respect to x and y (i.e. knowing the quantities $\gamma_0+\gamma_x''$ and $\gamma_0+\gamma_y''$), then the mode of implementation consists in finding the values of $d_x$ and $d_y$ that minimize the quantity G.

If the two quantities $\gamma_0+\gamma_x''$ and $\gamma_0+\gamma_y''$ are sought, knowing the two components $d_x$ and $d_y$ of the diffusion tensor, then the method of implementation consists in finding the values of the two quantities $\gamma_0+\gamma_x''$ and $\gamma_0+\gamma_y''$ that minimize the quantity G.

If the 3 quantities $d_x(\gamma_0+\gamma_x'')$; $d_y(\gamma_0+\gamma_y'')$; and $d_y(\gamma_0+\gamma_x'')+d_x(\gamma_0+\gamma_y'')$, then the mode of implementation consists in finding the values of these three quantities that minimize the quantity G:

$$G = \sum_{fx=fx\_min}^{fx\_max} \sum_{fy=fy\_min}^{fy\_max} (PSD(fx, fy, t) - PSD(fx, fy, 0) \cdot a(t)^2)^2.$$

In the three cases mentioned above, the numerical methodologies to be implemented so as to determine the desired quantities that minimize the quantity G, are known to those skilled in the art and notably described in the book by W. H. Press et al, "*Numerical Recipes, the Art of Scientific Computing*", 3rd edition, Cambridge University Press, 2007. Mention may also be made inter alia of the Levenberg-Marquardt method (page 801, section 15.5.2), the methods involving the gradient and the Hessian matrix (page 800 section 15.5.1), the Simplex methods (page 502 section 10.5) and the Powell method (page 509 section 10.7).

According to a second embodiment of the invention, the method uses not the square of the norm of the 2D Fourier transform, but directly this norm itself. The quantity G' is therefore defined by:

$$G' = \sum_{fx=fx\_min}^{fx\_max} \sum_{fy=fy\_min}^{fy\_max} (\|H(fx, fy, t)\| - \|H(fx, fy, 0)\| \cdot a(t))^2$$

In the same way, the double sum defining G' is performed over all the frequences $f_x=1/\lambda_x$ and $f_y=1/\lambda_y$ present in the 2D Fourier transform:
where $\|H(f_x,f_y,t)\|$ is the norm of the Fourier transform at the frequencies $f_x$ and $f_y$ and at time t, and
$\|H(f_x,f_y,0)\|$ is the norm of the Fourier transform at the frequencies $f_x$ and $f_y$ and at the initial time $t_0=0$.

If the two components of the diffusion tensor are sought, knowing the surface energies and their second derivatives with respect to x and y (i.e. knowing the quantities $\gamma_0+\gamma_x''$ and $\gamma_0+\gamma_y''$), then the mode of implementation consists in finding the values of $d_x$ and $d_y$ that minimize the quantity G'.

If the two quantities $\gamma_0+\gamma_x''$ and $\gamma_0+\gamma_y''$ are sought, knowing the two components $d_x$ and $d_y$ of the diffusion tensor, then the method of implementation consists in finding the values of the two quantities $\gamma_0+\gamma_x''$ and $\gamma_0+\gamma_y''$ that minimize the quantity G'.

If the 3 quantities $d_x(\gamma_0+\gamma_x'')$; $d_y(\gamma_0+\gamma_y'')$; and $d_y(\gamma_0+\gamma_x'')+d_x(\gamma_0+\gamma_y'')$, then the mode of implementation consists in finding the values of these three quantities that minimize the quantity G'.

In the above cases, the numerical methodologies to be implemented for determining the desired quantities that minimize G' are known to those skilled in the art and may be similar to those mentioned in the above embodiment relating to the quantity G.

In many applications for predicting the topological evolution of a surface, it is unnecessary to know directly the surface energies or the components of the diffusion tensor, but only the quantities:

$$Cd_x(\gamma_0+\gamma_x''); Cd_y(\gamma_0+\gamma_y''); C(d_y(\gamma_0+\gamma_x'')+d_x(\gamma_0+\gamma_y''))$$

In these applications of the invention, it is therefore unnecessary for the numerical value of the coefficient C to be known. It is possible (using one or other of the two options described above) to minimize the quantity G or G' in order to estimate the 3 useful quantities above, which already include the coefficient C.

This obviates the need to know the following parameters: the number of surface atomes per unit area $n_s$ and the atomic volume $\Omega_0$.

The method of the invention also allows very localized measurements of the diffusion tensor or the surface energies. To do this, indentation or nano-indentation techniques may be used to produce one or more local indentations or nano-indentations.

After this indentation or nano-indentation, a first topology measurement is then made according to the method of the invention, and then the surface finish is then made to evolve, for example by an annealing operation allowing surface diffusion to take place. A second topology measurement is then taken, so as to determine the diffusion tensor or the surface energies using the method described above.

It should be noted that the present invention has the advantage of not requiring the production of special devices for measuring the surface diffusion tensor anisotropies or surface energy anisotropies. A naturally rough surface, such as for example post-fracture surfaces, may be used.

Moreover, it is also possible to use artificially roughened surfaces. This is because it is quite easy for initially smooth surfaces to be intentionally roughened in a controlled manner. This may be done by chemical etching, by plasma etching or by electrolytic etching. These methods are known to those skilled in the art and are quite easy to implement.

Implementation of the measurement method of the invention requires conventional surface topology measurement tools and also conventional numerical methods, using an AFM-type instrument incorporating software for carrying out said measurement method.

With this type of instrument, the local diffusion anisotropy or energy anisotropy of a surface may typically be measured. The size of the measured area is directly the size on the scale of which this anisotropy is known. For example, in the case of AFM, this size is typical a square with sides of 1 to 10 μm.

What is claimed is:

1. Non-transitory computer readable medium containing a numerical simulation program for causing a computer processor to perform measuring and processing an anisotropic surface diffusion tensor or surface energy anisotropies of a surface defined by a function z(x,y) dependent on two co-ordinates (x,y) along two orthogonal directions, the Fourier transform of this surface enabling it to be decomposed into a sum of moderate-amplitude perturbations of initial amplitude ($a_0$) and of wavelengths ($\lambda_x$, $\lambda_y$), the amplitude/wavelength ratios ($a_0/\lambda_x$; $a_0/\lambda_y$) being less than about 0.3, comprising the following steps:
a first measurement of the surface topology enabling the Fourier transform $H(f_x,f_y,0)$ of this first topology to be determined at an instant $t_0=0$, $f_x$ and $f_y$ being the spatial frequencies;
a step in which said surface evolves by surface diffusion;
a second measurement of the surface topology after evolution of said surface, enabling the Fourier transform $H(f_x,f_y,t)$ of this second topology at an instant t to be determined, $f_x$ and $f_y$ being the spatial frequencies;
the determination of the components of the diffusion tensor or of the second derivatives of the surface energy, or a combination of the components of the tensor and of the second derivatives of the surface energy, enabling a measurement (G) of the deviation between a quantity $H(f_x,f_y,t)$ and a quantity $H(f_x,f_y,0) \cdot a(t)$ to be minimized,
where $$a(t) = \frac{a_0}{\sqrt{1+a_0^2\alpha_2(\max(f_x;f_y))^2} \cdot \sqrt{\exp\left(\frac{2t}{\tau_{therory}}\right) - \frac{a_0^2\alpha_2(\max(f_x;f_y))^2}{1+a_0^2\alpha_2(\max(f_x;f_y))^2}}}$$

$\alpha_2$ being dependent on $f_x$ and $f_y$, $f_x$ and $f_y$ being the spatial frequencies in the orthogonal directions associated with the co-ordinates x and y, and $$\tau_{theory} = \frac{1}{C(d_x f_x^2 + d_y f_y^2)((\gamma_0 + \gamma_x'')f_x^2 + (\gamma_0 + \gamma_y'')f_y^2)}$$

and $d_x$ and $d_y$ are the components of the diffusion tensor relative to the diffusion anisotropy in the x and y directions, $\gamma_0$ is the surface energy and $\gamma_x''$ and $\gamma_y''$ are the second derivatives of the surface energy with respect to the orientation of the surface in the directions associated with the co-ordinates x and y; and the measurement of the deviation (G) satisfies the following formula:

$$G = \sum_{fx=fx\_min}^{fx\_max} \sum_{fy=fy\_min}^{fy\_max} (PSD(fx, fy, t) - PSD(fx, fy, 0) \cdot a(t)^2)^2$$

where PSD $(f_x,f_y,t)$ is the power spectral density corresponding to the square of the norm of the Fourier transform at time t and PSD$(f_x,f_y,0)$ is the power spectral density at time $t_0$; and displaying the anisotropic surface diffusion tensor or the surface energy anisotropies of the surface material.

2. Non-transitory computer readable medium containing a numerical simulation program for causing a computer processor to perform measuring an anisotropic surface diffusion tensor or surface energy anisotropies according to claim 1, wherein the coefficient $\alpha_2$ satisfies the following equation:

$$\alpha 2 = \Sigma i = 0 i = 3 \square\square ci(1n\square[max\square[fx;fy]/min\square[fx;fy]])$$
$$i\Sigma i = 0 i = 3 \square\square bi\square(1n\square[max\square[fx;fy]/min\square[fx;fy]])i$$

$c_i$ and $b_i$ being constants.

3. Non-transitory computer readable medium containing a numerical simulation program for causing a computer processor to perform measuring an anisotropic surface diffusion tensor or surface energy anisotropies according to claim 1, wherein the measurement of the deviation (G) is obtained by a method of the Levenberg-Marquardt type or by a method involving the gradient and the Hessian matrix or by the Simplex method or by the Powell method.

4. Non-transitory computer readable medium containing a numerical simulation program for causing a computer processor to perform measuring an anisotropic surface diffusion tensor or surface energy anisotropies according to claim 1, wherein the topology measurement is of the ATM type.

5. Non-transitory computer readable medium containing a numerical simulation program for causing a computer processor to perform measuring an anisotropic surface diffusion tensor or surface energy anisotropies according to claim 1, wherein the topology measurement is of the optical profilometry type.

6. Non-transitory computer readable medium containing a numerical simulation program for causing a computer processor to perform measuring an anisotropic surface diffusion tensor or surface energy anisotropies according to claim 1, wherein the topology measurement is of the confocal microscopy type.

7. Non-transitory computer readable medium containing a numerical simulation program for causing a computer processor to perform measuring an anisotropic surface diffusion tensor or surface energy anisotropies according to claim 1, wherein it further includes a prior step of generating surface roughnesses.

8. Non-transitory computer readable medium containing a numerical simulation program for causing a computer processor to perform measuring an anisotropic surface diffusion tensor or surface energy anisotropies according to claim 7, wherein the roughnesses are generated by chemical etching.

9. Non-transitory computer readable medium containing a numerical simulation program for causing a computer processor to perform measuring an anisotropic surface diffusion tensor or surface energy anisotropies according to claim 7, wherein the roughnesses are generated by plasma etching.

10. Non-transitory computer readable medium containing a numerical simulation program for causing a computer processor to perform measuring an anisotropic surface diffusion tensor or surface energy anisotropies according to claim 7, wherein the roughnesses are generated by electrolytic etching.

11. Non-transitory computer readable medium containing a numerical simulation program for causing a computer processor to perform measuring an anisotropic surface diffusion tensor or surface energy anisotropies according to claim 7, wherein the roughnesses are generated by indentation or nano-indentation.

12. Non-transitory computer readable medium containing a numerical simulation program for causing a computer processor to perform measuring and processing an anisotropic surface diffusion tensor or surface energy anisotropies of a surface defined by a function z(x,y) dependent on two co-ordinates (x,y) along two orthogonal directions, the Fourier transform of this surface enabling it to be decomposed into a sum of moderate-amplitude perturbations of initial amplitude $(a_0)$ and of wavelengths $(\lambda_x, \lambda_y)$, the amplitude/wavelength ratios $(a_0/\lambda_x; a_0/\lambda_y)$ being less than about 0.3, comprising the following steps:

a first measurement of the surface topology enabling the Fourier transform $H(f_x,f_y,0)$ of this first topology to be determined at an instant $t_0=0$, $f_x$ and $f_y$ being the spatial frequencies;

a step in which said surface evolves by surface diffusion;

a second measurement of the surface topology after evolution of said surface, enabling the Fourier transform $H(f_x,f_y,t)$ of this second topology at an instant t to be determined, $f_x$ and $f_y$ being the spatial frequencies; and the determination of the components of the diffusion tensor or of the second derivatives of the surface energy, or a combination of the components of the tensor and of the second derivatives of the surface energy, enabling a measurement (G') of the deviation between a quantity $H(f_x, f_y, t)$ and a quantity $H(f_x, f_y, 0) \cdot a(t)$ to be minimized, where $$a(t) = \frac{a_0}{\sqrt{1 + a_0^2 \alpha_2 (\max(f_x; f_y))^2} \cdot \sqrt{\exp\left(\frac{2t}{\tau_{theory}}\right) - \frac{a_0^2 \alpha_2 (\max(f_x; f_y))^2}{1 + a_0^2 \alpha_2 (\max(f_x; f_y))^2}}}$$

$\alpha_2$ being dependent on $f_x$ and $f_y$, $f_x$ and $f_y$ being the spatial frequencies in the orthogonal directions associated with the co-ordinates x and y, and $$\tau_{theory} = \frac{1}{C(d_x f_x^2 + d_y f_y^2)((\gamma_0 + \gamma_x'')f_x^2 + (\gamma_0 + \gamma_y'')f_y^2)}$$

and $d_x$ and $d_y$ are the components of the diffusion tensor relative to the diffusion anisotropy in the x and y directions, $\gamma_0$ is the surface energy and $\gamma_x''$ and $\gamma_y''$ are the second derivatives of the surface energy with respect to the orientation of the surface in the directions associated with the co-ordinates x and y;

the measurement of the deviation (G') satisfies the following formula:

$$G' = \sum_{fx=fx\_min}^{fx\_max} \sum_{fy=fy\_min}^{fy\_max} (\|H(fx, fy, t)\| - \|H(fx, fy, 0)\| \cdot a(t))^2$$

where $\|H(f_x, f_y, t)\|$ is the norm of the Fourier transform at the frequencies $f_x$ and $f_y$ and at time t, and $\|H(f_x, f_y, 0)\|$ is the norm of the Fourier transform at the frequencies $f_x$ and $f_y$ and at the initial time $t_0=0$; and displaying the anisotropic surface diffusion tensor or the surface energy anisotropies of the surface material.

13. Non-transitory computer readable medium containing a numerical simulation program for causing a computer processor to perform measuring an anisotropic surface diffusion tensor or surface energy anisotropies according to claim 12, wherein the coefficient $\alpha_2$ satisfies the following equation:

$\alpha2=\Sigma i=0 i=3\square\square ci(1n\square[\max\square[fx;fy]/\min\square[fx;fy]])$
$i\Sigma i=0 i=3\square\square bi\square(1n\square[\max\square[fx;fy]/\min\square[fx;fy]])i$ $c_i$ and $b_i$ being constants.

14. Non-transitory computer readable medium containing a numerical simulation program for causing a computer processor to perform measuring an anisotropic surface diffusion tensor or surface energy anisotropies according to claim 12, wherein the measurement of the deviation (G') is obtained by a method of the Levenberg-Marquardt type or by a method involving the gradient and the Hessian matrix or by the Simplex method or by the Powell method.

15. Non-transitory computer readable medium containing a numerical simulation program for causing a computer processor to perform measuring an anisotropic surface diffusion tensor or surface energy anisotropies according to claim 12, wherein the topology measurement is of the AFM type.

16. Non-transitory computer readable medium containing a numerical simulation program for causing a computer processor to perform measuring an anisotropic surface diffusion tensor or surface energy anisotropies according to claim 12, wherein the topology measurement is of the optical profilometry type.

17. Non-transitory computer readable medium containing a numerical simulation program for causing a computer processor to perform measuring an anisotropic surface diffusion tensor or surface energy anisotropies according to claim 12, wherein the topology measurement is of the confocal microscopy type.

18. Non-transitory computer readable medium containing a numerical simulation program for causing a computer processor to perform measuring an anisotropic surface diffusion tensor or surface energy anisotropies according to claim 12, wherein it further includes a prior step of generating surface roughnesses.

19. Non-transitory computer readable medium containing a numerical simulation program for causing a computer processor to perform measuring an anisotropic surface diffusion tensor or surface energy anisotropies according to claim 18, wherein the roughnesses are generated by chemical etching.

20. Non-transitory computer readable medium containing a numerical simulation program for causing a computer processor to perform measuring an anisotropic surface diffusion tensor or surface energy anisotropies according to claim 18, wherein the roughnesses are generated by plasma etching.

21. Non-transitory computer readable medium containing a numerical simulation program for causing a computer processor to perform measuring an anisotropic surface diffusion tensor or surface energy anisotropies according to claim 18, wherein the roughnesses are generated by electrolytic etching.

22. Non-transitory computer readable medium containing a numerical simulation program for causing a computer processor to perform measuring an anisotropic surface diffusion tensor or surface energy anisotropies according to claim 18, wherein the roughnesses are generated by indentation or nano-indentation.

* * * * *

UNITED STATES PATENT AND TRADEMARK OFFICE
CERTIFICATE OF CORRECTION

PATENT NO. : 8,583,403 B2  
APPLICATION NO. : 12/433354  
DATED : November 12, 2013  
INVENTOR(S) : Francois De Crecy, Jean-Charles Barbe and Daniel Girardeau-Montaut Page 1 of 1

It is certified that error appears in the above-identified patent and that said Letters Patent is hereby corrected as shown below:

In the Claims:

Column 13, Claim 2, line 35; delete entire formula and replace with the following:

$$\alpha_2 = \frac{\sum_{i=0}^{i=3} c_i \left( \ln \left[ \frac{\max[f_x; f_y]}{\min[f_x; f_y]} \right] \right)^i}{\sum_{i=0}^{i=3} b_i \left( \ln \left[ \frac{\max[f_x; f_y]}{\min[f_x; f_y]} \right] \right)^i}$$

Column 15, Claim 13, line 31; delete entire formula and replace with the following:

$$\alpha_2 = \frac{\sum_{i=0}^{i=3} c_i \left( \ln \left[ \frac{\max[f_x; f_y]}{\min[f_x; f_y]} \right] \right)^i}{\sum_{i=0}^{i=3} b_i \left( \ln \left[ \frac{\max[f_x; f_y]}{\min[f_x; f_y]} \right] \right)^i}$$

Signed and Sealed this  
Twenty-first Day of April, 2015

Michelle K. Lee  
*Director of the United States Patent and Trademark Office*